United States Patent
Penney

(10) Patent No.: US 6,771,557 B2
(45) Date of Patent: Aug. 3, 2004

(54) PREDECODE COLUMN ARCHITECTURE AND METHOD

(75) Inventor: Daniel B. Penney, Wylie, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/643,268

(22) Filed: Aug. 18, 2003

(65) Prior Publication Data

US 2004/0052138 A1 Mar. 18, 2004

Related U.S. Application Data

(63) Continuation of application No. 10/014,013, filed on Nov. 5, 2001, now Pat. No. 6,628,565.

(51) Int. Cl.[7] ................................................. G11C 8/00
(52) U.S. Cl. ............................ 365/230.06; 365/189.05; 365/230.08; 365/230.09
(58) Field of Search ........................ 365/230.06, 189.05, 365/230.08, 230.09

(56) References Cited

U.S. PATENT DOCUMENTS

| | | | |
|---|---|---|---|
| 5,021,688 A | 6/1991 | Leforestier et al. ......... 307/463 |
| 5,592,434 A | 1/1997 | Iwamoto et al. ............. 365/233 |
| 5,781,497 A | 7/1998 | Patel et al. ............. 365/230.06 |
| 5,825,714 A | 10/1998 | Kohno .................... 365/230.06 |
| 5,841,727 A | * 11/1998 | Iwanari et al. ......... 365/230.03 |
| 5,881,009 A | * 3/1999 | Tomita ....................... 365/221 |
| 5,881,017 A | 3/1999 | Matsumoto et al. ... 365/230.04 |

OTHER PUBLICATIONS

Choi, Y. et al., "16–Mb Synchronous DRAM with 125–Mbyte/s Data Rate", IEEE Journal of Solid–State Circuits, vol. 29, No. 4, Apr. 1994, pp. 529–533.

Sunaga, T. et al., "A Full Bit Prefetch Architecture for Synchronous DRAM's", IEEE Journal of Solid–State Circuits, vol. 30, No. 9, Sep. 1995, pp. 998–1005.

* cited by examiner

*Primary Examiner*—Vu A. Le
*Assistant Examiner*—N. Nguyen
(74) *Attorney, Agent, or Firm*—Dorsey & Whitney LLP

(57) ABSTRACT

A system and method for predecoding memory addresses by generating a sequence of predecode signals based on the memory address, providing the sequence of predecode signals as a first set of activation signals, and based on the value of the memory address, either resequencing the sequence of predecode signals and providing the resequenced predecode signals as a second set of activation signals or providing the sequence of predecode signals as the second set of activation signals.

36 Claims, 6 Drawing Sheets

PREDECODE COLUMN ARCHITECTURE AND METHOD

CROSS-REFERENCE TO RELATED APPLICATION

This application is a continuation of pending U.S. patent application Ser. No. 10/014,013, filed Nov. 5, 2001 now U.S. Pat. No. 6,678,565.

TECHNICAL FIELD

This invention relates to memory devices capable of operating in a burst mode, and, more particularly, to a column address path for burst mode memory devices provide more optimum propagation of column addresses.

BACKGROUND OF THE INVENTION

Memory devices, including a synchronous dynamic random access memory (SDRAM) 10 shown in FIG. 1, typically receive both a row address and a column address that specify where data are to be transferred to or from within the memory device. The row and column addresses are initially applied to an address register 12 through an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26 that stores the row address, and a row decoder 28 that applies various signals to its respective array 20 or 22 as a function of the stored row address. The row address multiplexer 18 also couples row addresses to the row address latches 26 for the purpose of refreshing the memory cells in the arrays 20, 22. The row addresses are generated for refresh purposes by a refresh counter 30 that is controlled by a refresh controller 32.

After the row address has been applied to the address register 12 and stored in one of the row address latches 26, a column address is applied to the address register 12. The address register 12 couples the column address to a column address latch 40. In a normal operating mode, the column address is coupled through a burst controller 42 directly to an address buffer 44. However, in a burst operating mode, the burst controller 42 generates a sequence of column addresses starting at the column address applied to the burst controller 42 from the column address latch 40. For example, the burst controller 42 may operate in a "burst 2" mode, in which one additional column address is generated by the burst controller 42, a "burst 4" mode, in which three additional column addresses are generated by the burst controller 42, and a "burst 8" mode, in which seven additional column addresses are generated by the burst controller 42. The burst controller 42 may also operate in either of two burst modes, namely a serial mode, in which the addresses generated by the burst controller 42 are sequential, or an interleaved mode, in which the addresses generated by the burst controller are sequential except that only the least significant bit (LSB) toggles between each pair of even and odd addresses. As discussed in greater detail below, it is important that column addresses generated by the burst controller 42 be quickly coupled to the column address buffer 44 after the burst controller 42 receives the initial column address from the column address latch 40.

After the burst controller 42 applies a column address to the column address buffer 44 in either the normal mode or the burst mode, the column address buffer 44 applies the column address to a column decoder 48. As is well known in the art, the column decoder 48 applies various signals to respective sense amplifiers and associated column circuitry 50, 52 for the respective arrays 20, 22.

Data to be read from one of the arrays 20, 22 is coupled to the column circuitry 50, 52 for the arrays 20, 22, respectively. The data are then coupled to a data output register 56, which applies the data to a data bus 58. Data to be written to one of the arrays 20, 22 are coupled from the data bus 58 through a data input register 60 to the column circuitry 50, 52 where they are transferred to the arrays 20, 22, respectively. A mask register 64 may be used to selectively alter the flow of data into and out of the column circuitry 50, 52, such as by selectively masking data to be read from the arrays 20, 22.

The above-described operation of the SDRAM 10 is controlled by a command decoder 68 responsive to high-level command signals received on a control bus 70. These high level command signals, which are typically generated by a memory controller (not shown in FIG. 1), are a clock enable signal CKE*, a chip select signal CS*, a write enable signal WE*, a row address strobe signal RAS*, and a column address strobe signal CAS*, which the "*" designating the signal as active low. The command decoder 68 generates a sequence of control signals responsive to the command signals to carry out the function (e.g., a read or a write) designated by the command signals. These control signals, and the manner in which they accomplish their respective functions, are conventional. Therefore, in the interest of brevity, a further explanation of these control signals will be omitted. The high-level command signals are clocked into the command decoder 68 in synchronism with a clock signal CLK. The CLK signal, or internal clock signals (not shown) generated from the CLK signal, control the timing at which the control signals carry out their respective functions in the SDRAM 10. The control signals are preferably registered with both the rising and falling edges of the CLK signal (or internal clock signals) so that two operations are accomplished each period of the CLK signal. An SDRAM 10 operating in this manner is known as a "double data rate DRAM" because two bits of data are read from or written to the SDRAM 10 for each clock CLK pulse.

One conventional design for a portion of the burst controller 42 is illustrated in FIG. 2. The burst controller 42' may include substantially more circuitry than is shown in FIG. 2, but this circuitry has been omitted in the interest of brevity because this additional circuitry is not particularly relevant to the problem that the disclosed invention is intended to solve. External column address signals XA9–XA0 (or XA<9:0>) are coupled to the SDRAM 10 through the address bus 14 (FIG. 1) and then through the address register 12 to the column address latch 40. As previously mentioned, the burst controller 42' then outputs column address designated as IA<9:0> to the column address buffer 44. In the burst mode, bits IA<0> and IA<9:3> of the internal column address are generated differently from the remaining bits IA<1> and IA<2> of the internal column address. More specifically, the IA<0> and IA<9:3> bits are generated by coupling the external bits A<0> and A<9:3> from respective column address latches 40 through a respective column address path 90. The reason these bits are generated differently is that the maximum size of the burst is 8 bits, and 8 bits can be counted using three bits of the internal address, i.e., IA<2:0>. The bits IA<9:3> of the internal column address are constant as the IA<2:0> bits are incremented by a count of either 2, 4 or 8, depending upon the length of the burst. The IA<0> bit selects whether an even or an odd-numbered column will be initially addressed, and it toggles with each edge of the CLK signal, assuming the SDRAM 10 is a double data rate SDRAM.

As mentioned above, in the burst mode, the IA<2> and IA<1> bits are incremented from their initial values for even column addresses under certain conditions. This incrementing is accomplished for the column address bits of the burst by adder logic circuits 100 and 102. Latched external address bits LA_S1 and LA_S2 are applied to an input of a respective multiplexer 110, 112. The other input of each multiplexer receives a respective set of bits from a burst counter 116. The burst counter 116 supplies the bits CNT1_INC and CNT2_INC for all column addresses of a burst after the first bit of the burst. Each multiplexer 110, 112 is controlled by a RDWRA signal that has a first logic level during the first bit of a burst and has a second logic level during the remaining bits of the burst. The multiplexers 10, 12 thus couple the input of respective drivers 120, 122 to the respective latched external address during the first bit of a burst, and then to the burst counter 116 during the remaining bits of the burst. The adder logic circuits 100, 102 receive a latched external address bits LA_S0 and a respective external address bit LA_S1 and LA_S2 from the drivers 120, 122 respectively. The adder logic circuits 100, 102 then output respective even address bits IAE1 and IAE2. The column address bits IAO1, IAE1, IAO2, and IAE2, as well as remaining bits of the column address are coupled to the outputs of the column address path 90, output the resulting bits IA<9:0> to the column decoder 48 (FIG. 1).

As previously mentioned, the columns in the memory banks 20, 22 are divided into even-numbered and odd-numbered columns. The IA<2> and IA<1> bits of each column address for the odd-numbered columns (in which the IA<0> bit is a "1") in the first bit of each burst are generated directly from the XA<2> and XA<1> bits so that IA<2>=XA<2> and IA<1>=XA<1>. The IA<2> and IA<1> bits of each column addresses for the even-numbered columns (in which the IA<0> bit is a "0") in the first bit of each burst are generated by the adder logic circuits 100, 102.

In summary, the burst controller 42' functions to make the internal address bit IA<1> equal to the external address bit XA<1> when the burst controller 42' is operating in the burst 2 mode or the interleaved mode or when the external address bit XA<0> is "0". The internal address bit IA<1> is equal to the complement of the external address bit XA<1> when the burst controller 42' is operating in the interleaved mode and in either the burst 4 or 8 mode and the external address bit XA<0> is "1". Similarly, the above-described circuitry functions to make the IA<2> bit equal to the external address bit XA<2> when the burst controller 42' is operating in the burst 2 or burst 4 mode or the interleaved mode or when the XA<0> bit is "0" or the XA<1> bit is "0". The internal address bit IA<2> is equal to the complement of the external address bit XA<2> when the burst controller 42' is operating in the serial mode and in the burst 8 mode and the external address bits XA<0> and XA<1> are both "1".

The major disadvantage of the circuitry used in the burst controller 42' of FIG. 2 stems from the number of circuit components the external address bits must be coupled through to generate the internal address bits. Specifically, from the address latch 40, the LA_S1 signal for the even columns is coupled through the multiplexer 110, the driver 120, the adder logic 100. In contrast, the LA_S1 signal for the odd columns is coupled through only a multiplexer 110. A similar disparity exists between the LA_S2 signal for the odd columns and the LA_S2 signal for the even columns.

As a result, the internal address bits IA<2:1> for the even columns reach the column decoder 44 (FIG. 1) substantially later than the internal address bits IA<2:1> for the odd columns. In addition to this lack of symmetry, the inherent delay in passing the latched address bits LA_S1 and LA_S2 through the circuit components unduly delays the time that the column decoder 44 can begin decoding a column address.

As the speed at which memory devices continues to increase, these delays in decoding, addresses can markedly slow the operating speed of memory devices. There is therefore need for a burst controller that is capable of outputting internal addresses with less delay than the prior art burst controller described above.

SUMMARY OF THE INVENTION

The present invention is directed to a method and system for predecoding memory addresses by generating a sequence of predecode signals based on the memory address, providing the sequence of predecode signals as a first set of activation signals, and based on the value of the memory address, either resequencing the sequence of predecode signals and providing the resequenced predecode signals as a second set of activation signals or providing the sequence of predecode signals as the second set of activation signals. The address predecoder includes a decoder having input terminals for receiving memory address signals and further having output terminals for providing predecode signals. Based on the column memory address signals, the decoder selects one of the output terminals on which to provide an active predecode signal. The address predecoder also includes a shifting circuit having inputs coupled to the output terminals of the decoder and control terminals for receiving shift control signals. The shifting circuit provides first and second sets of activation signals on respective output terminals. The first set of activation signals correspond to the predecode signals. In response to receiving inactive shift control signals, the shifting circuit provides a second set of activation signals corresponding to the predecode signals, and in response to receiving active shift control signals, the shifting circuit reorders the predecode signals into a shifted arrangement which are provided as the second set of activation signals.

DETAILED DESCRIPTION OF THE INVENTION

Certain details are set forth below to provide a sufficient understanding of the invention. However, it will be clear to one skilled in the art that the invention may be practiced without these particular details. In other instances, well-known circuits, control signals, timing protocols, and software operations have not been shown in detail in order to avoid unnecessarily obscuring the invention.

Figure 1:
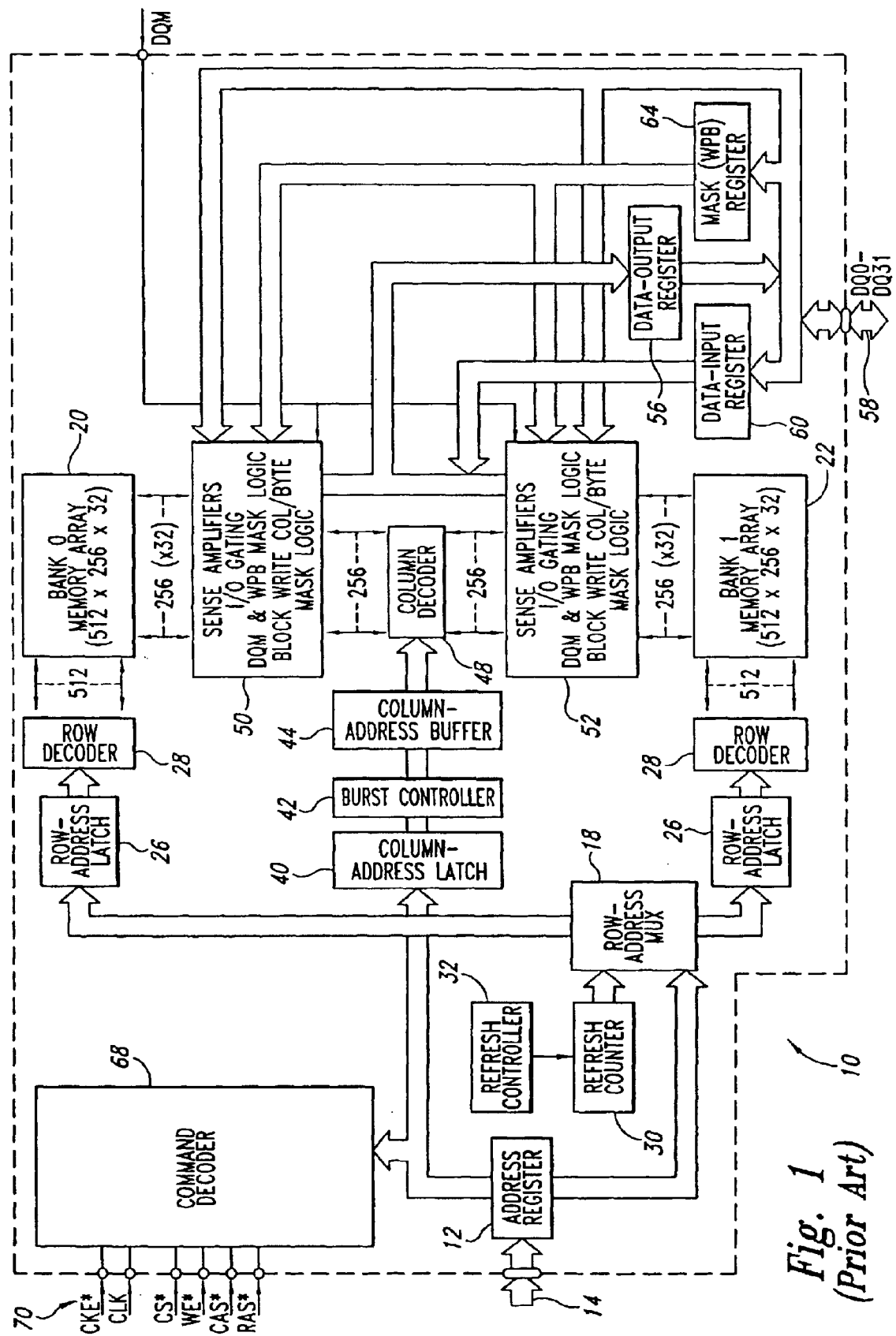
FIG. 1 is a block diagram of a conventional memory device that may use either a conventional burst controller or an embodiment of a burst controller in accordance with the present invention.
Figure 2:
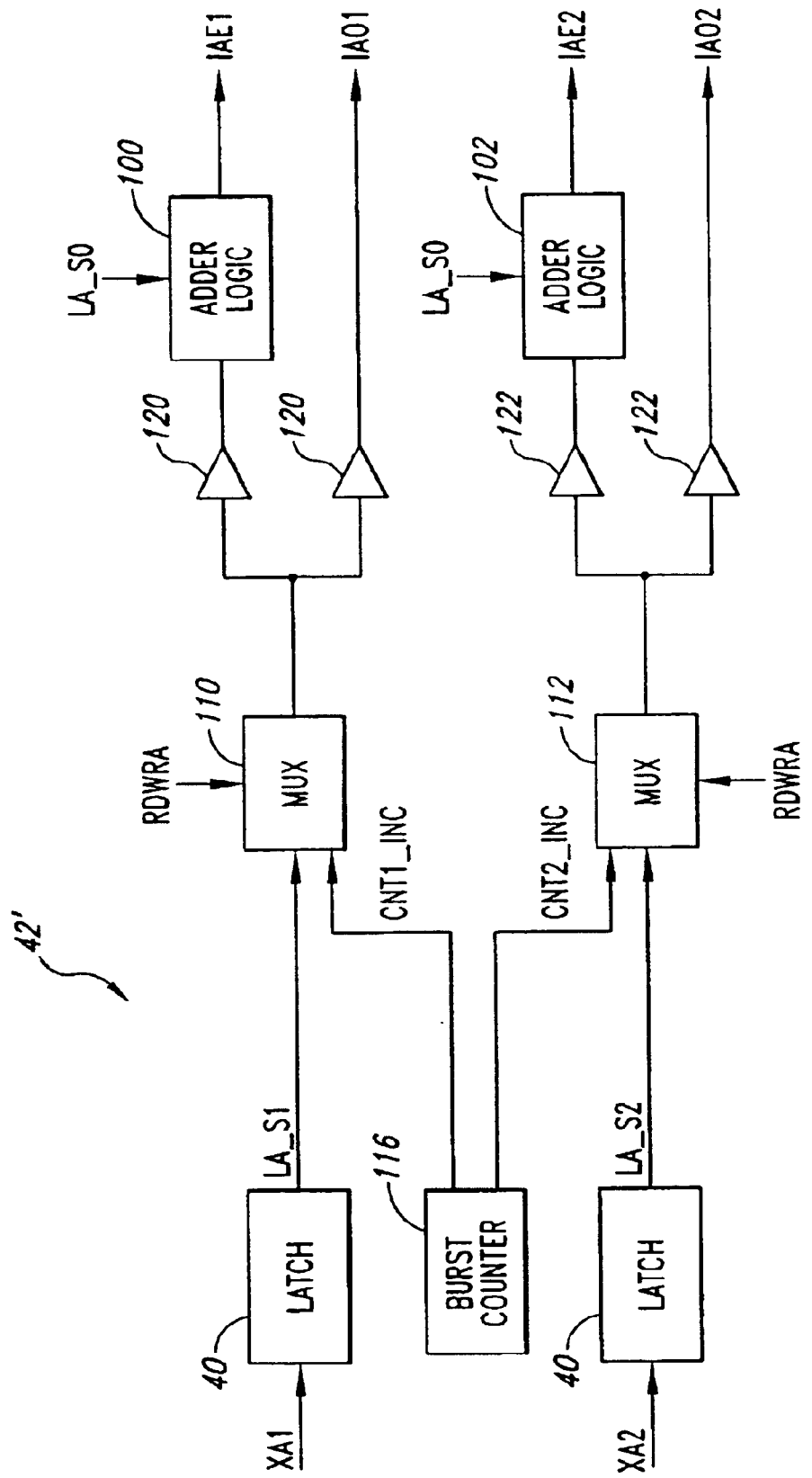
FIG. 2 is a block diagram of a portion of a conventional burst controller.
Figure 3:
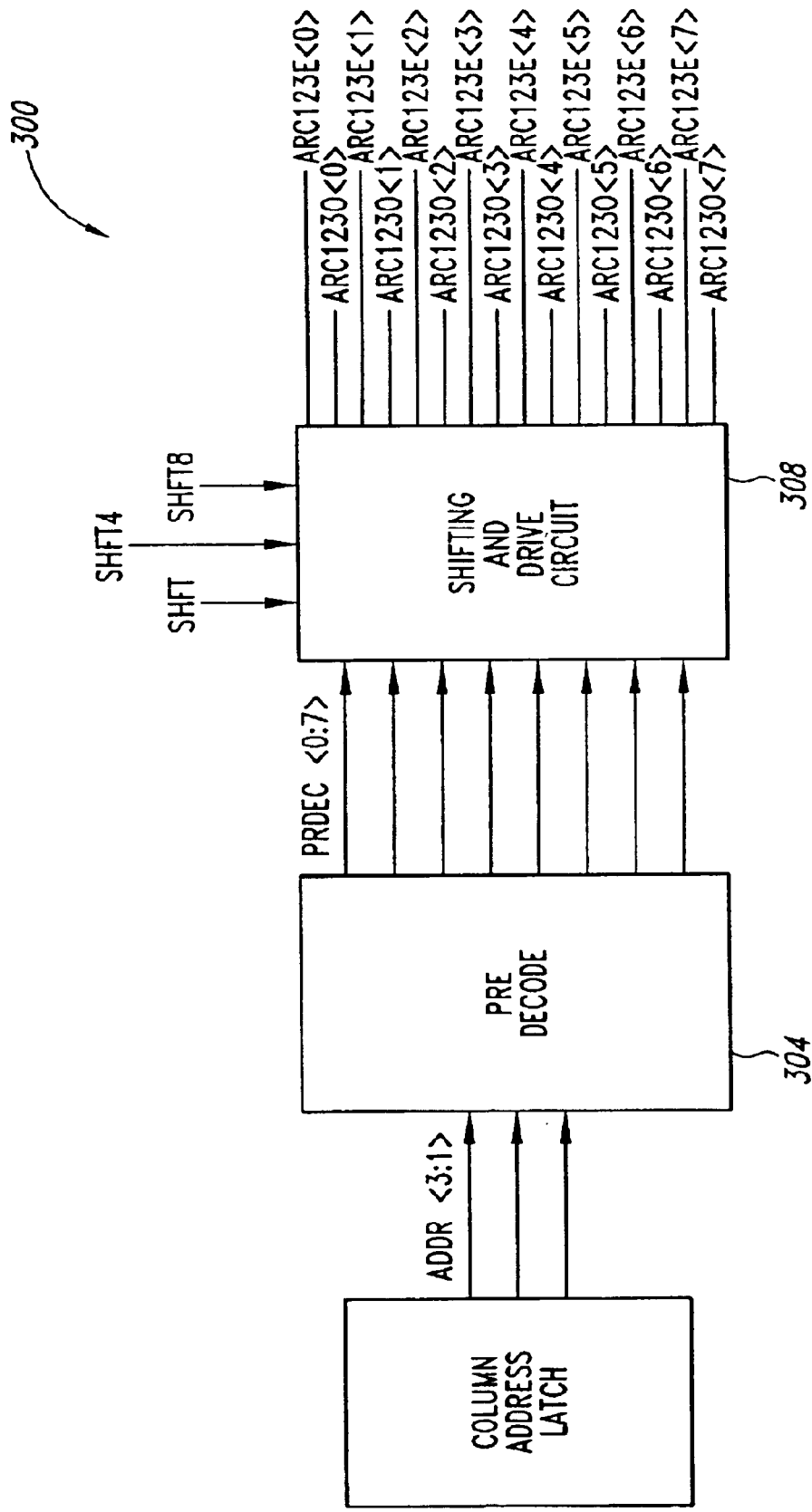
FIG. 3 is a block diagram of a showing a prefetch circuit according to an embodiment of the present invention.

FIG. 3 illustrates a prefetch circuit 300 according to an embodiment of the present invention. The prefetch circuit 300 can be included in the column decoder 48 of FIG. 1. As illustrated in FIG. 3, the prefetch circuit 300 is for use with an architecture where the columns of the memory array are arranged in groups of eight, and one of the eight are selected for access. It will be appreciated, however, that embodiments of the present invention may be modified to accommodate various column groupings without departing from its scope. The prefetch circuit 300 includes a predecode circuit 304 coupled to receive address signals representing external address bits XA<3:1> from a column address latch 40 and the burst controller 42 (FIG. 1). The terms "signals" and "bits" will be used generally interchangeably herein. The predecode circuit 304 generates predecode signals PRDEC<7:0> from the XA<3:1> signals, which will in turn be used by a shifting and drive circuit 308 to generate activation signals ARC123E<7:0> and ARC123O<7:0> for selecting the appropriate memory columns of even and odd memory arrays. As will be explained in more, ARC123E<7:0> and ARC123O<7:0> can be generated by the shifting and drive circuit 308 approximately simultaneously, thus, avoiding the delays from generating column switch activation signals associated with adder logic circuits, as is typical with conventional burst controller circuits.

Figure 4:
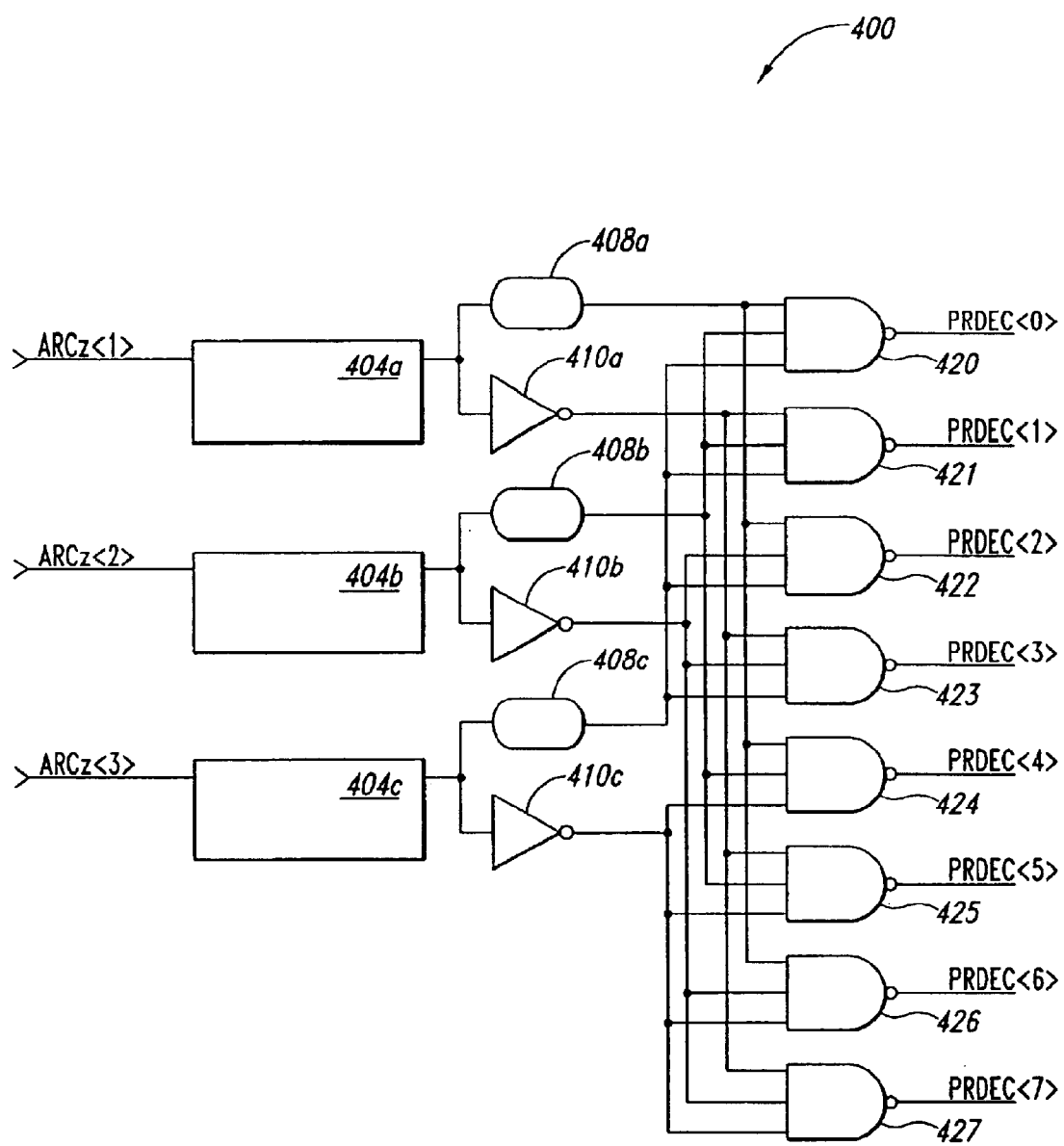
FIG. 4 is a block diagram of a predecode circuit according to an embodiment of the present invention.

FIG. 4 illustrates a predecode circuit 400 according to an embodiment of the present invention. The predecode circuit 400 can be substituted for the predecode circuit 304 shown in FIG. 3. The XA<3:1> bits signals are latched by respective latches 404a–c and provided through buffers 408a–c or inverters 410a–c to NAND gates 420–427. Note that each of the latches 404a–c provides an inverted output signal. Thus, the XA<3:1>* signals are provided at the output of the inverters 410a–c and the XA<3:1> signals are provided at the output of the buffers 408a–c. The asterisk indicates inverted or complementary signals. The design of circuitry for generating such complementary signals is well known and can be implemented using conventional designs. Thus, in the interest of brevity, further description of signal inverting circuitry has been omitted from herein.

Each of the NAND gates 420–427 receives a different combination of three inputs consisting of the XA<3:1> signals or the XA<3:1>* signals. Consequently, for each combination of address signals XA<3:1>, only one of the NAND gates will have a LOW signal at its output. For example, where the XA<3:1> signal is 101B, only the NAND gate 425 will have an LOW output signal while the rest of the NAND gates 420–424, 426, and 427 will have HIGH output signals. Thus, the sequence or arrangement of the predecode signals PRDEC<7:0> are determined by the value or logic states of the XA<3:1> signals. As will be explained in more detail below, the PRDEC<7:0> signals are provided to the shifting and drive circuit 308 (FIG. 3) and will be arranged into an order or sequence such that the appropriate activation signals ARC123E<7:0> and ARC123O<7:0> are provided for selecting two columns from corresponding even and odd memory arrays.

Figure 5:
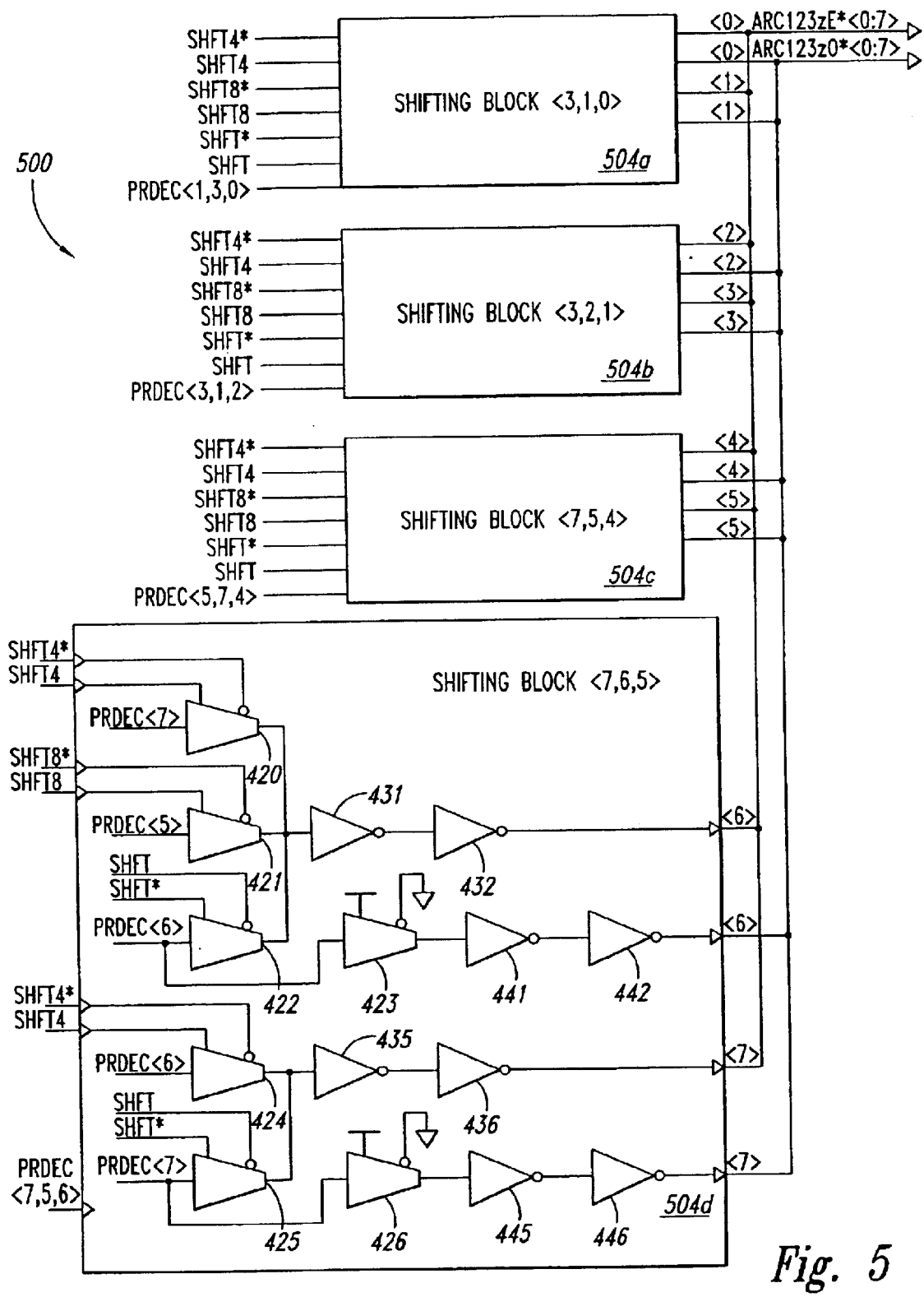
FIG. 5 is a block diagram of a column decoder circuit according to an embodiment of the present invention.
Figure 6:
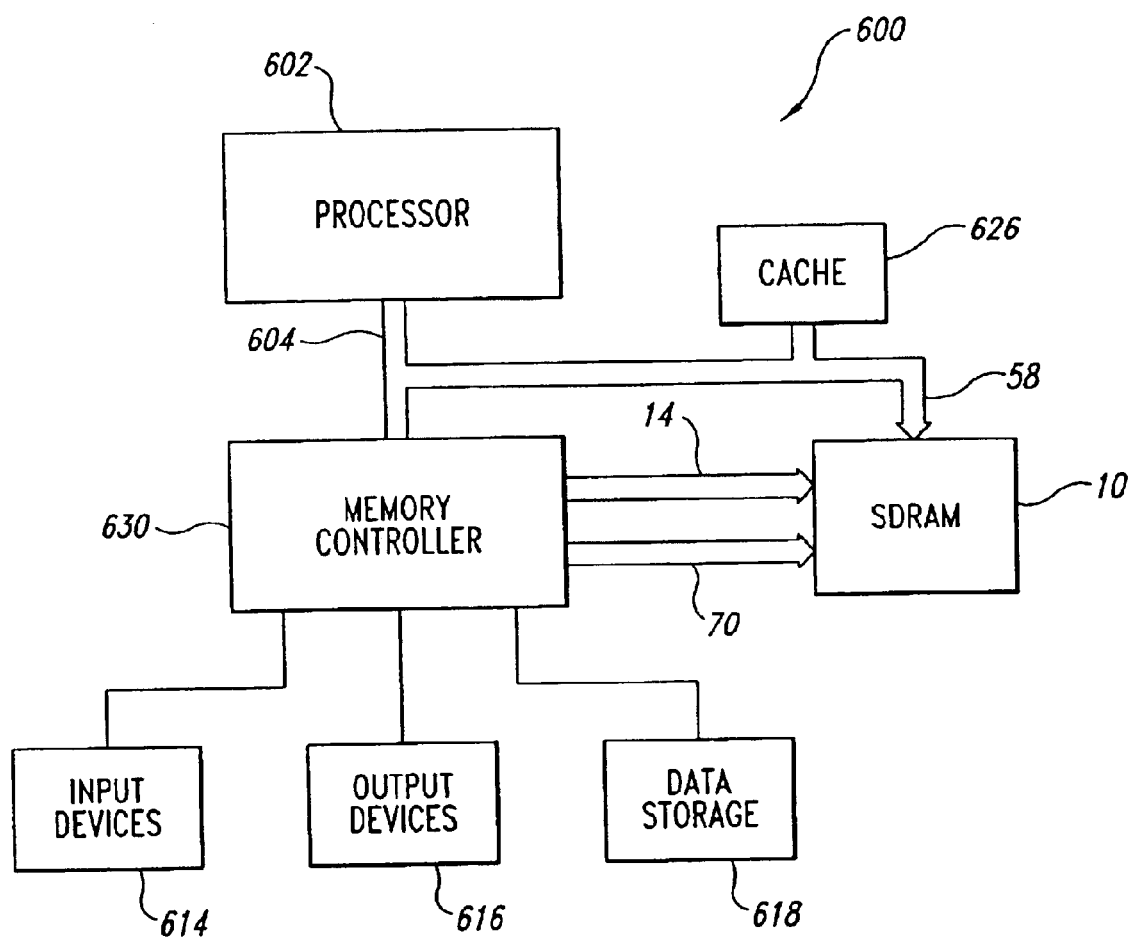
FIG. 6 is a block diagram of a computer system using the memory device of FIG. 1 containing the prefetch circuit of FIG. 3.

FIG. 5 illustrates a column decoder circuit 500 according to an embodiment of the present invention. The column decoder circuit 500 can be substituted for the shifting and drive circuit 308 shown in FIG. 3. The column decoder circuit 500 includes shifting blocks 504a–d. The shifting blocks 504a–d receive the predecode signals PRDEC<0,1, 3>, PRDEC<03,2,1>, PRDEC<7,5,4>, and PRDEC<7,6,5>, respectively. Each of the shifting blocks 504a–d provides two of each of the ARC123E<7:0> and ARC123O<7:0> signals.

The shifting blocks 504a–d further receive shift control signals SHFT, SHFT4, and SHFT8, and their respective inverted signals, SHFT*, SHFT4*, and SHFT8*. Although not shown in FIG. 5, the circuitry for generating the SHFT signal provides an active SHFT signal when the starting column address is odd (i.e., XA<0> is a "1"). Circuitry for generating the SHFT4 and SHFT 8 signals provides active SHFT4 and SHFT8 signals in response to a burst 4 or burst 8 command being requested, respectively, and receiving an odd starting column address. Conversely, where neither a burst 4 or burst 8 command has been requested, the SHFT4 and SHFT8 signals will be inactive. Design of such circuitry is well known by those of ordinary skill in the art and can be implemented without providing a more detailed description herein. As will be explained in more detail below, the shift control signals determine the arrangement into which the PRDEC<7:0> signals are arranged to produce the ARC123E<7:0> and ARC123O<7:0> signals. For example, where the SHFT4 and SHFT8 signals are inactive, the PRDEC<7:0> signals are not rearranged or resequenced to produce the ARC123E<7:0> and ARC123O<7:0> signals.

The shifting blocks 504a–d are functionally similar, and consequently, a detailed explanation for only shifting block 504d is provided below for the sake of brevity. The PRDEC<7,6,5> signals from the predecode circuit 304 (FIG. 3) are provided to transfer gates 420–426 of the shifting block 504d. Specifically, the PRDEC<7> signal is provided to the transfer gates 420, 425, and 426; the PRDEC<6> signal to the transfer gates 422, 423, and 424; and the PRDEC<5> signal to the transfer gate 421. The outputs of the transfer gates 420–426 are coupled to a respective series connected pair of inverters 431–432, 435–436, 441–442, and 445–446. As mentioned previously, the activation of the transfer gates 420–422, 424, and 425 are controlled by the SHFT, SHFT4, and SHFT8 signals. Consequently, the SHFT, SHFT4, and SHFT8 signals control the selection of which predecode signal to couple to the pair of inverters 431–432 and 435–436. The control terminals of the transfer gates 423 and 426 are coupled to a voltage source and a ground node. In order to simulate the signal latency of a signal coupled through the transfer gates 420–422, 424, and 425, transfer gates 423 and 426 are inserted into the signal path, and remain constantly active when the memory device is powered on. As a result, the phase relationship between the ARC123E<7:6> and ARC123O<7:6> signals can maintained.

The output of the pair of inverters are then used as part of the activation signals ARC123E<7:0> and ARC123O<7:0>. As illustrated in FIG. 5, the output of the inverter 432 provides the ARC123E<6> signal, the output of the inverter 442 provides the ARC123O<6> signal, the output of the inverter 436 provides the ARC123E<7> signal, and the output of the inverter 446 provides the ARC123O<7> signal. As mentioned previously, the shifting blocks 504a–c are functionally similar to the shifting block 504d. However, each shifting block provides a different two bits of the even and odd activation signals ARC123E<7:0> and ARC123O<7:0>, respectively. That is, the shifting block 504a provides the ARC123E<1:0> and ARC123O<1:0> signals, the shifting block 504b provides the ARC123E<3:2> and ARC123O<3:2> signals, and the shifting block 504*c* provides the ARC123E<5:4> and ARC123O<5:4> signals. The composite even and odd activation signals ARC123E<7:0> and ARC123O<7:0> are then used for generating column switch activation signals to access two memory columns of the even and odd memory arrays.

Operation of the prefetch circuit 300 will be made with reference to the predecode circuit 400 of FIG. 4 and the column decoder circuit 500 of FIG. 5. It will be appreciated that the following description is provided by way of example, and that details provided in the following description may be modified without departing from the scope of the present invention.

Consider the case where the four LSB of external column address (i.e., XA<3:0>) is 1100B and the burst length is four. Two (two-bit) accesses will be needed to access the four bits. The first access will be based on the external column address, and the second access will be based on an incremented column address provided by the burst controller 42 (FIG. 1). Thus, for the first access, the XA<3:0> signals are 1100B and for the second access, the XA<3:0> signals are 1110B.

For the first access, the XA<3:1> signals 110B are provided to the predecode circuit 400. As a result, only the output of the NAND gate 426 is LOW, and the PRDEC<7:0> signals output by the predecode circuit 400 is 1011 1111B. As mentioned previously, where the input address to the memory device is an even address, that is, the XA<0> is zero, the SHFT, SHFT4, and SHFT8 signals are kept in a LOW state. Consequently, the shifting blocks 504*a–d* do not shift the arrangement of the PRDEC<7:0> signals provided by the predecode circuit 400, but rather, will provide the same value for both the even and odd activation signals. That is, both the ARC123E<7:0> and ARC123O<7:0> signals are 1011 1111B to activate the seventh column of both the even and odd memory arrays to provide access to the first and second memory locations of the burst 4 access. Specifically with respect to the shifting block 504*d*, the transfer gates 420, 421, and 424 remain deactivated while the transfer gates 422 and 425 are activated to couple the PRDEC<6> and PRDEC<7> signals to the input of inverters 431 and 435, respectively. The PRDEC<6> and PRDEC<7> signals are then provided for both the ARC123E<7:6> and ARC123O<7:6> signals.

The second access based on column address 1110B proceeds in the same manner as described above, except that the XA<3:1> signals are 111B and the resulting PRDEC<7:0> signals are 1011 1111B. The resulting even and odd activation signals ARC123E<7:0> ARC123O<7:0> are 0111 1111B to activate the eighth column of the even and odd memory arrays to provide access to the third and fourth memory locations of the burst 4 access.

The previous example was for the case where an even external column address is provided to the prefetch circuit 300. However, where an odd external column address is provided, the prefetch circuit 300 shifts the PRDEC<7:0> signals to generate the appropriate ARC123E<7:0> and ARC123O<7:0> signals. For example, consider the case where the four LSB of the external column address XA<3:0> is 1101B and the burst length is four. Two memory accesses will be needed to access the four bits. The first access will be based on the external column address, and the second access will be based on an incremented column address provided by the burst controller 42 (FIG. 1). Thus, for the first access, the XA<3:0> signals are 1101B and for the second access, the XA<3:0> signals are 1111B.

For the first access, the XA<3:1> signals 110B are provided to the predecode circuit 400. As a result, only the output of the NAND gate 426 is LOW, and the PRDEC<7:0> signals output by the predecode circuit 400 is 1011 1111B. Unlike the previous example, the XA<0> is one, and thus, the SHFT signal is HIGH. Because of the selection of a four bit burst length, and the XA<0> signal being HIGH, SHFT4 is also HIGH and SHFT8 is LOW. As a result, the column decoder circuit 500 will shift the bits of the PRDEC<7:0> signals such that the appropriate columns of the even and odd memory arrays are selected for access. With respect to the shifting block 504*d*, the HIGH SHFT and SHFT4 signals activate the transfer gates 420 and 424, respectively, while the transfer gates 421, 422, and 425 remain deactivated. Consequently, the PRDEC<7> signal is provided as the ARC123O<7> and ARC123E<6> signals, and the PRDEC<6> signal is provided as the ARC123O<6> and ARC123E<7> signals. As for the shifting blocks 504*a–c*, the PRDEC<5:0> signals are all HIGH and any shifting by the respective shifting blocks are of no consequence to the resulting activation signals ARC123E<7:0> and ARC123O<7:0>. Thus, the resulting even activation signal ARC123E<7:0> is 0111 1111B, and the resulting odd activation signal ARC123O<7:0> is 1011 1111B. The resulting ARC123E<7:0> and ARC123O<7:0> signals are then provided for selecting the columns from the even and odd memory arrays, respectively. For the odd memory array, the seventh column is selected (i.e., corresponding to XA<3:1> signals 110), and for the even memory array, the eighth column is selected (i.e., corresponding to XA<3:1> signals 111).

The second access proceeds in the same manner as described above, except that the XA<3:1> signals are now 111B, and consequently, the PRDEC<7:0> signals are 1011 1111B. The XA<0> signal is still one, and thus, the column decoder circuit 500 will shift the bits of the PRDEC<7:0> signals such that the appropriate columns are selected to access the even and odd memory arrays. The SHFT and SHFT4 signals are still HIGH and, with respect to the shifting block 504*d*, the transfer gates 420 and 424 are activated and the transfer gates 421, 422, and 425 remain deactivated. As a result, the PRDEC<7> signal is provided as the ARC123O<7> and ARC123E<6> signals and the PRDEC<6> signal is provided as the ARC123O<6> and ARC123E<7> signals. As with the first access, the shifting of shifting blocks 504*a–c* are still of no consequence to the resulting activation signals ARC123E<7:0> and ARC123O<7:0>. Thus, the resulting even activation signal ARC123E<7:0> is 1011 1111B, and the resulting odd activation signal ARC123O<7:0> is 0111 1111B. The resulting ARC123E<7:0> and ARC123O<7:0> signals are then provided for selecting the eighth column of the odd memory array and the seventh column of the even memory array.

As illustrated by the previous examples, embodiments of the present invention employ shifting circuitry in the column decoder to select the appropriate columns of related even and odd memory arrays. Consequently, issues relating to the complexity of additional circuitry, such as logic adders and separate address busses, and inherent delays with conventional column decode architecture can be avoided by embodiments of the present invention. It will be appreciated that although the present invention has been described herein with respect to simultaneously accessing two memory columns, one from an even memory array and another from an odd memory array, based on a starting column address, all or some of the principles of the present invention may be extended to simultaneously accessing more than the two columns previously described. Consequently, the particular number of columns accessed simultaneously should not be interpreted as limiting the scope of the present invention.

FIG. 7 is a block diagram of a computer system 300 that includes the SDRAM 10 of FIG. 1, including the column address bust controller of FIG. 4. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor to store data or retrieve data from internal or external storage media (not shown). Examples of typical storage devices 318 include hard and floppy disks, tape cassettes, and compact disk read-only memories (CDROMs). The processor 302 is also typically coupled to cache memory 326, which is usually static random access memory ("SRAM") and to the SDRAM 10 through a memory controller 330. The memory controller 330 normally includes the control bus 70 and the address bus 14 that is coupled to the SDRAM 10. The data bus 58 may be coupled to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of generating first and second internal memory addresses from an external memory address for accessing memory locations in respective memory arrays corresponding to the external memory address, the method comprising:

generating a predecode address having a predecode sequence of binary digits, the predecode sequence based on a portion of the external memory address;

in response to the external memory address having an even value, providing the predecode address in the predecode sequence as the first and second internal memory addresses; and in response to the external memory address having an odd value, providing the predecode address in the predecode sequence as the first internal memory address, changing the predecode address into a modified sequence, and providing the modified predecode address as the second internal memory address.

2. The method of claim 1 wherein shifting the predecode address into a modified sequence comprises shifting the predecode address to result in the first and second internal memory addresses having sequential values.

3. The method of claim 1, further comprising receiving a burst length command having a burst length value, and wherein shifting the predecode address into the modified sequence is based on the external memory address having an odd value and the burst length value.

4. The method of claim 3, further comprising generating first and second pairs of internal memory addresses in response to a first burst length value and generating first, second, third and fourth pairs of internal memory addresses in response to a second burst length value.

5. The method of claim 1 wherein generating a predecode address comprises generating an address value having all but one of the bits at a first value.

6. The method of claim 5 wherein shifting the predecode address into a modified sequence comprises shifting the bit of the predecode address not having the first value to a different bit location.

7. The method of claim 1 wherein N bits of the external memory address are used to generate the predecode address and the predecode address is 2**N bits in length.

8. The method of claim 7 wherein N is equal to three.

9. In a memory device, a method of generating a pair of internal burst addresses for a burst operation from an external memory address, the method comprising:

generating a plurality of predecode signals having logic levels based on the external memory address;

applying the predecode signals as the first of the pair of internal burst addresses; and based on the value of the external memory address, applying the predecode signals as the second of the pair of internal burst addresses in response to the external memory address having a first value, and in response to the external memory address having a second value, rerouting the predecode signals into a reordered arrangement to be applied as the second of the pair of internal burst addresses.

10. The method of claim 9 wherein the first value is an even value and the second value is an odd value.

11. The method of claim 9 wherein rerouting the predecode signals comprises shifting the order of the bits of the predecode signals before applying the shifted bits as the second of the pair of internal burst addresses.

12. The method of claim 9, further comprising receiving a burst length command having a burst length value, and wherein rerouting the predecode signals is based on the external memory address having the second value and the burst length value.

13. The method of claim 12, further comprising generating first and second pairs of internal addresses in response to a first burst length value and generating first, second, third and fourth pairs of internal addresses in response to a second burst length value.

14. The method of claim 9 wherein generating the plurality of predecode signals comprises generating plurality of predecode signals based on N bits of the external address.

15. The method of claim 14 wherein the predecode signal is 2**N bits in length.

16. A method for generating internal memory addresses in response to receiving an external memory address, the method comprising:

predecoding the external memory address;

providing the predecoded external memory address as a first internal memory address; and providing the predecoded external memory address as a second internal memory address in response to an even valued external memory address; and reordering the sequence of bits of the predecoded external memory address and providing the reordered predecoded external memory address as the second internal memory address in response to an odd valued external memory address.

17. The method of claim 16 wherein reordering the sequence of bits of the predecoded external memory address comprises shifting the order of the bits of the predecoded external memory address before applying the shifted bits as the second internal memory address.

18. The method of claim 16, further comprising receiving a burst length command having a burst length value, and wherein reordering the sequence of bits is in response to an odd valued external memory address and based on the burst length value.

19. The method of claim 18, further comprising generating first and second pairs of internal memory addresses in response to a first burst length value and generating first, second, third and fourth pairs of internal memory addresses in response to a second burst length value.

20. The method of claim 16 wherein predecoding the external memory address comprises predecoding the external memory address based on N bits of the external memory address.

21. The method of claim 20 wherein the predecoded external memory address is 2**N bits in length.

22. A method for generating internal memory addresses in response to receiving an external memory address, the method comprising:
   predecoding N bits of the external memory address to generate a 2**N bit predecode address having one active bit;
   applying the 2**N bit predecode address as a first internal memory address for accessing a first memory array; and
   in response to the least significant bit (LSB) of the external memory address is equal to zero, applying the 2N bit predecode address as a second internal memory address for accessing a second memory array, and in response to the LSB of the external memory address is equal to one, reordering the sequence of bits of the 2N bit predecode address to a modified sequence of 2N bits and applying the modified 2N bits as the second internal memory address.

23. The method of claim 22 wherein N is equal to three.

24. The method of claim 22 wherein predecoding N-bits of the external memory address comprises generating a predecoded memory address having all but one of the bits at a first value.

25. The method of claim 24 wherein reordering the sequence of bits of the predecode address comprises shifting the bit of the predecoded memory address not having the first value to a different bit location.

26. The method of claim 22 wherein reordering the sequence of bits of the predecode address comprises shifting the predecode address to result in the first and second internal memory addresses having sequential values.

27. The method of claim 22, further comprising receiving a burst length command having a burst length value, and wherein reordering the sequence of bits of the predecode address is based on the burst length value.

28. The method of claim 27, further comprising generating first and second pairs of internal memory addresses in response to a first burst length value and generating first, second, third and fourth pairs of internal memory addresses in response to a second burst length value.

29. A method for generating internal memory addresses for a burst memory operation from an external memory address, the method comprising:
   predecoding the external memory address into a predecoded address;
   providing the predecoded address as first and second internal memory addresses in response to the external memory address being an even value; and
   in response to the external memory address being an odd value, providing the predecoded address as the first internal memory address, reordering the bit sequence of the predecoded address and providing the reordered predecoded address as the second internal memory address, the predecoded address and the reordered predecoded address sequential in value.

30. The method of claim 29 wherein reordering the bit sequence of the predecoded address comprises shifting the predecoded address to result in the first and second internal memory addresses having sequential values.

31. The method of claim 29, further comprising receiving a burst length command having a burst length value, and wherein reordering the bit sequence is based on the burst length value.

32. The method of claim 31, further comprising generating first and second pairs of internal memory addresses in response to a first burst length value and generating first, second, third and fourth pairs of internal memory addresses in response to a second burst length value.

33. The method of claim 29 wherein predecoding the external memory address comprises generating an address value having all but one of the bits at a first value.

34. The method of claim 33 wherein reordering the bit sequence of the predecoded address comprises shifting the bit of the predecoded address not having the first value to a different bit location.

35. The method of claim 29 wherein N bits of the external memory address are used for predecoding the external memory address and the predecoded address is 2**N bits in length.

36. The method of claim 35 wherein N is equal to three.

* * * * *